United States Patent [19]

Meyer et al.

[11] 3,790,866

[45] Feb. 5, 1974

[54] SEMICONDUCTOR DEVICE ENCLOSURE AND METHOD OF MAKING SAME

[75] Inventors: Carl L. Meyer; Eugene H. Sayers, both of Kokomo, Ind.

[73] Assignee: General Motors Corporation, Detroit, Mich.

[22] Filed: May 14, 1973

[21] Appl. No.: 360,366

[52] U.S. Cl....... 317/234 R, 317/234 A, 317/234 G, 317/234 N, 29/576

[51] Int. Cl.............................................. H01l 5/00

[58] Field of Search.................... 317/234; 29/576 T

[56] References Cited

UNITED STATES PATENTS 3,519,896 7/1970 Kelley................................ 317/234

*Primary Examiner*—Rudolph V. Rolinec
*Assistant Examiner*—E. Wojciechowicz
*Attorney, Agent, or Firm*—Robert J. Wallace

[57] ABSTRACT

An economical power transistor housing and method for making it. The housing base member is of a reinforced plastic with a unique circuit pattern on it. A metal heat sink member nests in an aperture in the base member and connects with the circuit pattern. The heat sink has orientation means. A semiconductor device die with mutually parallel wire bond contact pads is affixed to the heat sink member in a predetermined manner. Terminal pins extend through the base member and connect with uniquely configured discrete portions of the circuit pattern. These portions have elongated mutually parallel wire bonding areas oriented perpendicular to the contact pads on the die. A cup-shaped cover encloses the die and associated wire bonds on the board. The structure permits automated assembly, soldering and wire bonding, and includes the manufacture of subassemblies for testing prior to device completion.

7 Claims, 11 Drawing Figures

PATENTED FEB 5 1974

3,790,866

SHEET 1 OF 2

SEMICONDUCTOR DEVICE ENCLOSURE AND METHOD OF MAKING SAME

BACKGROUND OF THE INVENTION

This invention relates to semiconductor device enclosures and to methods of making such enclosures. More specifically it relates to a unique economical power transistor housing and to a method for making such a housing, especially on an automatic basis.

Cost and reliability are as important to semiconductor devices as electrical performance. It is easily understood that two of the more important cost factors are material cost and labor cost. One can readily appreciate that more economical semiconductor devices can be made by simply using less or less costly materials and labor. However, costs can be reduced even further if the process for making the product yields a greater percent of acceptable product. It is therefore desirable to use a manufacturing process that inherently produces extremely high yields. One can attain high overall process yields by substituting improved process steps that have higher yields. Unfortunately, many semiconductor device manufacturing processes inherently require one or more steps that do not have very high yields to obtain highest device performance and reliability. We have noted that in most processes a substandard intermediate product cannot be identified immediately following such a low yield step. The substandard product must be virtually completely finished before it can be determined if it is in fact an acceptable or substandard device. If substandard completely finished devices must be discarded, the cost of making them must be absorbed by the acceptable finished products.

We have discovered an economical and unique power semiconductor enclosure and method of making it which uses less expensive materials and can be assembled on an automated basis. However, in addition, our structure can be made in the usual standard outline configuration. Also, our structure and process inherently allows lower final yield losses through the use of improved process steps previously not permissible, and automatic orientation and placement of parts. In addition, subassemblies are used which can be individually tested at various stages midstream in the assembly process, with parts of the subassemblies being reclaimable for reuse. Accordingly, a significantly higher percent of finished devices will be acceptable and their average cost will be lower.

OBJECTS AND SUMMARY OF THE INVENTION

It is, therefore, an object of this invention to provide a unique economical power transistor package.

Another object of this invention is to provide a unique economical assembly method.

These and other objects are attained with a semiconductor device enclosure having a reinforced plastic circuit board type of material as an enclosure base member. The enclosure base member has a distinctive conductive pattern on it. An aperture in the enclosure base member within the pattern receives a metal heat sink member on which a semiconductor device element is affixed. The metal heat sink member has orientation means thereon and the semiconductor device element is oriented on the heat sink with respect to it. The element has parallel wire bond contact pads on it, and discrete filamentary wires extend from them to discrete portions of the conductive pattern. Terminal pins are connected to the discrete portions. A cup-shaped cover is affixed to the base member over the bonding wires and element.

In the assembly process a plurality of housing base members are partially formed between two connecting side rails as a ladder-like frame. Oriented semiconductor dies are individually tested, and acceptable dies affixed to oriented heat sinks where they are tested again. Acceptable die-heat sink subassemblies are inserted in their respective aligned housing base members and connecting wires bonded, whereupon the resultant intermediate product can be tested again. Acceptable devices can then be finished and tested a final time.

BRIEF DESCRIPTION OF THE DRAWING

Other objects, features and advantages of this invention will become more apparent from the following description of the specific embodiments thereof and from the drawing, in which.

DESCRIPTION OF THE PREFERRED EMBODIMENTS

Figures 1, 2:
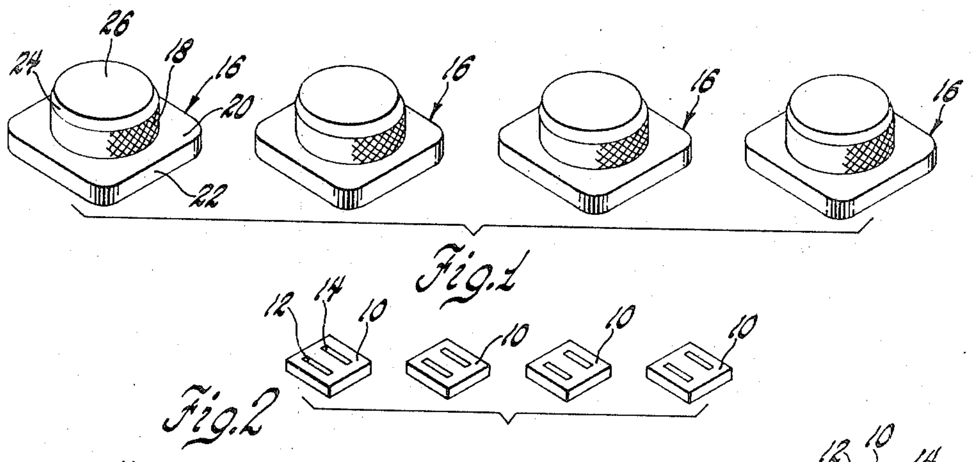
FIGS. 1 through 9 illustrate the heat sinks, the semiconductor device dies and the base member frame in various successive stages of assembly.
Figure 3:
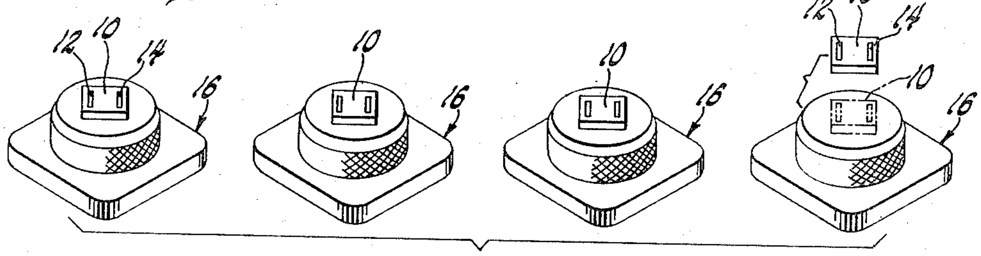

Any type of semiconductor device can be produced in accordance with this invention. However, for purposes of illustration we shall describe an enclosure for a power mesa transistor die and method of making it. A plurality of such dies is illustrated in FIG. 2. A mesa transistor die 10 is a die of a semiconductor material such as silicon having an emitter region of one conductivity type embedded in a stratum of the die forming the base region of the transistor. This stratum is of opposite conductivity type and forms one major face of the die. The base region stratum is contiguous a stratum of the one conductivity type, which serves as a collector region for the transistor and forms the opposite face of the die. A silicon dioxide coating covers the base region face of the die and a nickel coating covers the collector region face of the die. Two separate evaporated aluminum contacts overlie the silicon dioxide coating on the base region face. The two aluminum contacts extend through respective windows in the silicon dioxide coating to the base and emitter regions of the transistor.

It is especially important to this invention that each evaporated aluminum contact have an elongated wire bond region on the die surface, and that the two regions be mutually parallel. The elongated region for the base contact is indicated at 12, and the elongated region for the emitter contact is indicated at 14. This facilitates wire bonding, especially automatic wire bonding, as will subsequently be described.

In the assembly process a plurality of metal heat sinks 16 are prepared, as by cold forming or the like. They are shown in FIG. 1. Each heat sink has a cylindrical body portion 18, with two generally parallel flat end faces and a circumferential flange 20 at one end. The radial periphery 22 on flange 20 is of a generally rectangular configuration to facilitate automatic handling and orientation of the heat sink. Other configurations may be used for flange 20, and for that matter the heat sink orientation means need not even be a flange. However, a flange is much preferred. It not only facilitates orientation but also eases heat sink handling and provides a heat sink seating shoulder. The opposite end of heat sink body portion 18 is tapered at 24 to facilitate its insertion in the housing base member as will subsequently be described. The heat sink is preferably made of oxygen-free copper. However, any other suitable metal, as for example nickel plated aluminum, could be used. In addition, it may be desirable that the radial surface of body portion 18 be knurled to aid in mechanically locking the heat sink within the enclosure base member.

A plurality of heat sinks 16 are identically oriented to form a group of similarly oriented heat sinks, as shown in FIG. 1. A group of discrete similarly oriented mesa transistor dies 10 are then prepared, as shown in FIG. 2. While the semiconductor dies can be oriented by hand, it is preferred that these dies be actually made in an oriented condition, and the orientation subsequently preserved in handling. This can be accomplished by originally designing such orientation in the photomasks of the wafer from which these dies are made. After wafer processing is completed, the wafer is placed on a support which will maintain the original disposition of the dies during dicing. For example, the wafer can be placed on a flexible adhesive membrane, diced, and then individually released to a pickup probe. The pickup probe places the die on a second support, as for example an adhesive strip, which maintains the orientation of the die for further processing. Other techniques are also available for maintaining the die orientation during dicing and afterward. Dies can be tested before and after dicing, if desired. Unacceptable dies can be discarded after dicing and before mounting on heat sinks 16.

A circular preform (not shown) of a suitable solder, as for example 90 percent lead and 10 percent tin, by weight, is placed on the upper surface 26 of each oriented heat sink. An oriented acceptable mesa transistor die 10 is placed on the solder perform, and the assembly heated to reflow the solder and bond the die to the heat sink. The solder preforms and dies can each be progressively placed on a plurality of heat sinks, or a plurality of each can be simultaneously positioned in successive steps. In any event, the soldering can be done in excess of 450° C. in a hydrogen atmosphere to insure highest yields of reliable solder bonds. For the usual cold welded enclosures, the much lower temperature and much lower reliability liquid flux soldering is required, to avoid annealing the copper that is to be cold welded.

During the heating the die can be easily contained on the surface of the heat sink so that it will not lose its orientation. The net result is to produce a group of oriented die-heat sink subassemblies which can be readily individually tested. Those devices which do not meet desired performance levels can be set aside. Accordingly, only acceptable dies need be mounted, and only those dies mounted successfully need be processed further. Unsuccessfully mounted dies can be readily be removed from the heat sink by heating, and the heat sinks reclaimed for use again. Only acceptable oriented die-heat sink subassemblies need then be inserted in enclosure base members.

Figure 4:
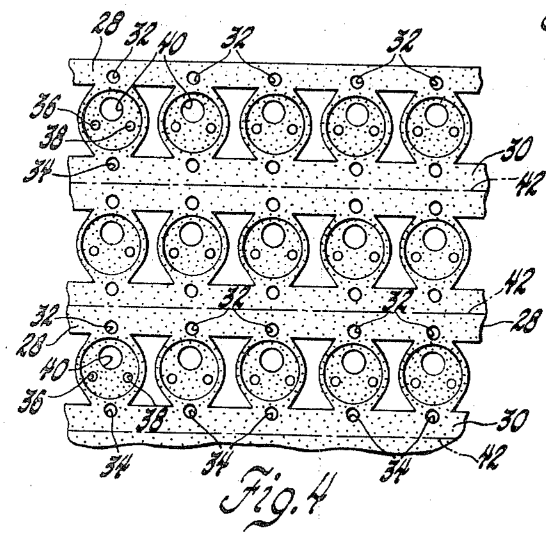

A frame containing a plurality of similarly oriented enclosure base members is shown in FIG. 4. The enclosure base member frame is made of a reinforced plastic material having a copper coating thereon. By reinforced plastic material, we mean a material in which a plastic binds together and is reinforced by random fibers or sheets of asbestos, fiberglass, cellulosic substances, or the like. The sheets may be of random fibers such as felt or paper or of oriented fibers such as a woven fabric of glass fibers. The plastic is preferably a thermosetting organic resin of the epoxy, polyester or phenolic type. These materials are frequently used with a copper coating for printed circuit boards. One such circuit board material that can be used is identified as G-10, which is an epoxy resin bonded laminate of woven glass fiber cloths. Other printed circuit board materials that can be used for the base member are XXP and XXXP, which are phenolic resin bonded paper sheets. A plurality of frames can be simultaneously prepared from a large sheet of such circuit board material.

The copper coating on a plain sheet of such circuit board material can be etched in the normal and accepted manner, as for example with an aqueous solution of ferric chloride. The sheet is etched to form a plurality of parallel linear repetitive package base circuit patterns, as shown in FIG. 4. After the pattern is formed, the sheet is stamped to define part of the housing base periphery and the connecting side rails 28 and 30.

The package being described herein is of a generally diamond-like configuration, as for example a JEDEC TO-3 housing. The length of the diamond shape lies transverse side rails 28 and 30, with the middle portion of the diamond between the rails and the ends of the diamond coextensive with the rails. Thus, a ladder-like configuration is produced. Apertures 32 and 34 are also punched in the frame side rails 28 and 30, respectively. Apertures 32 and 34 serve as indexing means for the housing base member frame during processing and subsequently serve as the package attachment holes in the finished product. Concurrently, two terminal pin apertures 36 and 38 are formed in each housing base element, as well as an aperture 40 to receive the previously tested and oriented die-heat sink subassembly. The individual ladder-like frames are then separated from the larger sheet along the lines 42.

The backside of each package base element is machined to form a large circular recess 44. Recess 44 is preferably of about the same diameter as the outer diameter on a flange on the cup-shaped cover which is to be secured. This will permit staking of the cover to the base member within the base member thickness should such staking be desired. For this purpose additional holes 46 can be provided in the base member. Recess 44 should at least be large enough to accommodate the circumferential flange 20 on heat sink member 16, and preferably of a depth 4 – 8 mils less than the thickness of radial edge 22 on flange 20. This will insure good contact between the heat sink element 16 and a supporting heat sink should one choose to mount the finished package on the heat sink. In this connection, it should be noted that the reinforced plastic board has a flexibility that readily permits such mounting without fear of fracture by bolting down too tightly. Hence, it provides a decided advantage over a similar structure made with a ceramic board material.

Figure 5:
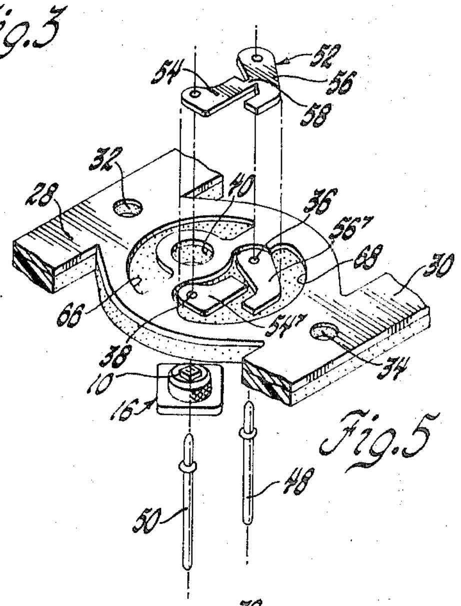

As can be seen in FIG. 5, terminal pins 48 and 50 are then inserted in the apertures 36 and 38 in each base member portion of the frame. A wire bond contact subassembly 52 is then placed over the terminal pins. The wire bond contact subassembly comprises two L-shaped members 54 and 56 and a connecting fuse link 58. The L-shaped members are arranged to have two overlapping parallel legs, with their opposite ends having apertures therein through which the terminal pins extend. The wire bond contact pad subassembly is preferably of laminated metal, with the lamination providing an aluminum upper surface and a solder coated lower surface. The solder can be the same as previously mentioned. The solder coated lower surface of the contact subassembly 52 registers over discrete portions of the copper pattern of a complementary configuration, without the fuse link, on the enclosure base member. The fuse link 58 in the wire bond contact subassembly 52 maintains a predetermined relative disposition between L-shaped members 54 and 56. The apertures in these members assure positive location of the subassembly 52 on the terminal pins 48 and 50. Thus, the subassembly is automatically brought into registration with the complementary discrete pattern portions 54′ and 56′ on the enclosure base member. Subassembly 52 can be omitted if pattern discrete portions 54′ and 56′ are otherwise adapted for wire bonding. For example, portions 54′ and 56′ can be partially aluminum coated to adapt them for wire bonding, leaving portions surrounding terminal pins 48 and 50 uncoated for solderability.

A frame of housing base members having terminal pins 48 and 50 and contact subassemblies 52 thereon is brought into proximity with a plurality of acceptable and oriented die-heat sink subassemblies. A die-heat sink subassembly is then pressed into the aperture 40 of each housing base member in the frame. As can be seen, a portion of the circuit pattern surrounds aperture 40. Short arms extend therefrom to a peripheral encircling portion of the pattern which covers the balance of the upper surface of the housing base member. Two arms are used, and the arms extend along the shortest path between the inner and outer pattern portions. This reduces lead resistance between the outer pattern portion and the inner pattern portion. The inner pattern portion completely encircles the heat sink for analogous reasons. In addition it permits the narrow parts of the arms to be shorter and provides a circumferential soldering area to bond the heat sink in place.

Figure 6:
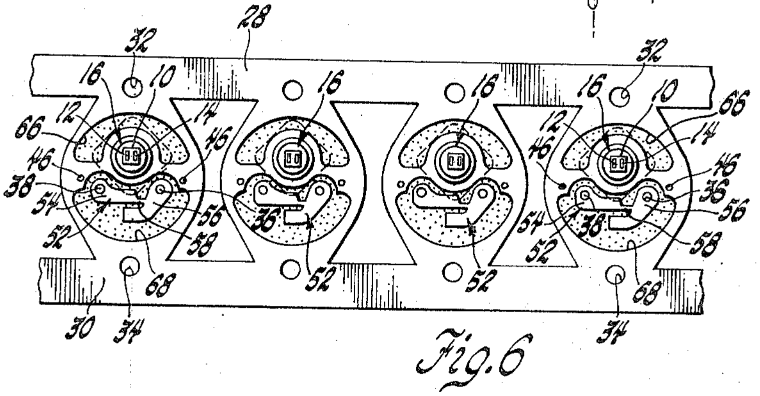

An annular preform of the same solder previously mentioned is then pressed around the heat sink into contact with the circuit portion of the pattern surrounding recess 40 to form a completed assembly ready for soldering as shown in FIG. 6. In this connection it is to be noted that the parallel wire bond regions 12 and 14 on die 10 are at right angles to the parallel leg portions 54 and 56 on the wire bond contact pads of subassembly 52.

Figure 7:
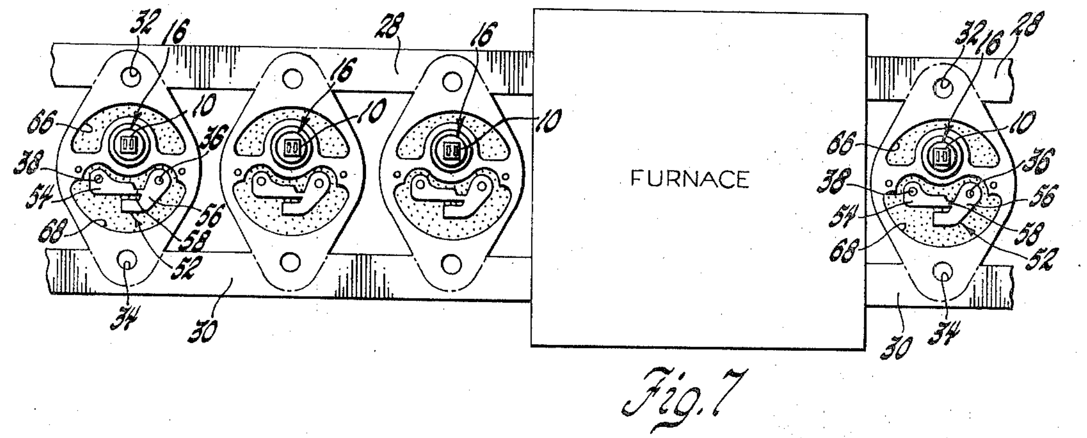

The assembly shown in FIG. 5 is then passed through a furnace, as shown in FIG. 7, to solder the terminal pins and both subassemblies to the circuit pattern.

After the subassemblies have been soldered to the circuit board, the fuse link 58 between portions 54 and 56 of the wire bond lead frame assembly can be severed. This can easily be done by merely passing a surge of current between terminal pins 48 and 50. Since the underlying circuit pattern on the housing base member does not have a fuse link in its configuration, passage of the current and severing of the fuse link 58 in subassembly 52 electrically isolates subassembly portions 54 and 56 and their underlying discrete pattern portions 54′ and 56′, as well as terminal pins 48 and 50. The frame of the housing base member is then ready for wire bonding.

Figure 8:
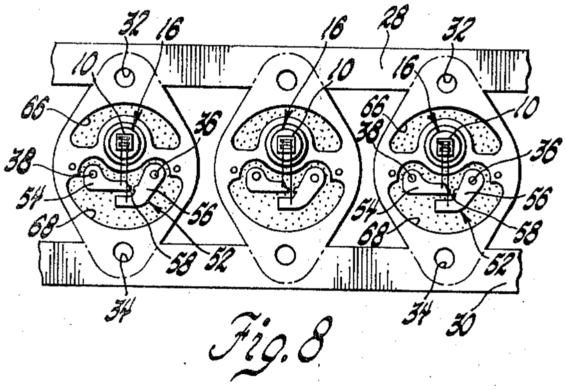
Figure 9:
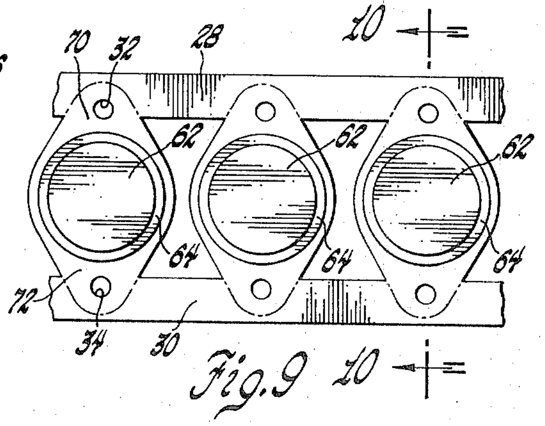
Figure 10:
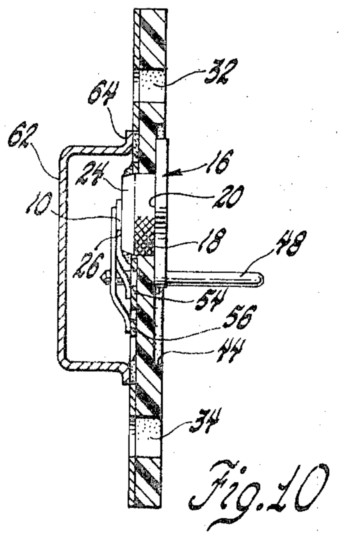
FIG. 10 is a sectional view along the line 10—10 of FIG. 9 showing a finished device.

Ultrasonic wire bonders have excellent tolerance for linear movement but not for rotational motion about a given point, especially if they are of the automatic or semi-automatic type. However, as can be seen in connection with FIG. 8 parallel contact pads 12 and 14 on die 10 are at right angles to the parallel portions 54 and 56 of the terminal lead contacts. Very little, if any, rotational movement about die 10 is needed to easily make the wire bonds. While filamentary gold wire can be used for wire bonding, we prefer to use filamentary aluminum wire. A much more reliable device can be made if the bonding system, e.g., the die contact pads, the terminal pin wire bonding contact surfaces, and the filamentary wire, are all of the same metal. Filamentary aluminum and gold wire can be ultrasonically bonded in the normal and accepted manner.

After the wire bonding, should it be desired, a small dab of a silicone elastomer can be placed over the die to insure hermetic sealing and good passivation of exposed junctions. However, it is preferred that device passivation be done in prior steps. One technique by which the die can be passivated before it is even released from the wafer in which it was formed is described in United States patent application A-18,681, entitled "Method of Applying Silicone Passivants to Etch Moats in Mesa Device Wafers," which was filed in the names of Mark L. Konantz and Ronald K. Leisure, and is assigned to the assignee of this invention.

The device can then be capped by adhesively bonding a cup-shaped cover element 62 over the parts assembled as described. The cup-shaped cover element has a circumferential flange portion 64 to provide a larger area for adhesion to the housing base member. One suitable adhesive that can be used is a silicone resin adhesive. Another is an epoxy resin. Since the die itself is preferably passivated on the heat sink, the cover member serves as only a mechanical form of protection for the die, the bonding wires and the passivant. It need not provide a hermetic seal. Accordingly, the cover 62 can be of any suitable material. It may be desirable to mechanically stake the cover in place instead of or in addition to adhesively bonding it. Staking insures positive location of the cover, and provides a temporary fastening means even when adhesive bonding is also used.

In addition, it should be noted that it is extremely difficult to obtain satisfactory adhesion to the copper portion of the circuit pattern itself. Accordingly, for adhesive bonding of the cover, major portions of the copper layer forming the circuit pattern are removed in a general circular area on the housing base member to permit as much area of flange portion 64 on cover 62 to directly contact the reinforced plastic material as possible. As can be seen more clearly in connection with FIGS. 6 through 8, generally semicircular areas 66 and 68 are provided where the copper has been removed from the housing base member in forming the circuit pattern. The diameter of these semicircular areas generally corresponds to the outer diameter of flange 64 but is preferably slightly larger.

Figure 11:
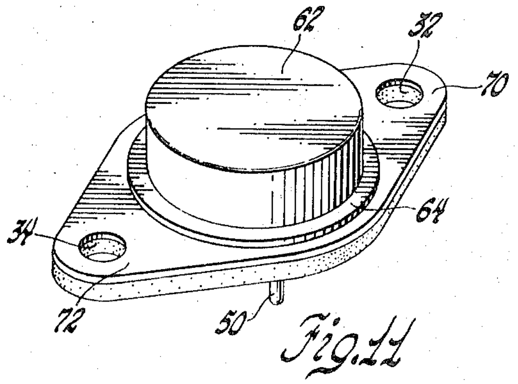
FIG. 11 is an isometric elevational view showing a finished device housing separated from its base member frame.

Lastly, base member ends 70 and 72, which are coextensive with the rail portions 28 and 30, respectively, of the frame, are stamped out of the frame to release the individual finished discrete transistor device. The finished device is shown in FIG. 11.

As previously mentioned it is understood that this invention has been described in connection with the manufacture of a discrete power transistor having a mesa transistor die. However, it is to be understood that the principles of this invention can be applied in making a housing for any form of semiconductor device.

We claim:

1. An economical and highly reliable semiconductor device which can be made in standard enclosure outlines, said device comprising:
a reinforced plastic board member of a selected peripheral shape having a major surface,
a conductive pattern on said major surface,
said pattern including a first portion,
a second portion separated from the first portion by a space, at least one third portion interconnecting said first and second portions through said space, and
at least two discrete portions in said space between said first and second portions,
an aperture through said board member and pattern first portion,
a metal heat sink member nested in said aperture and electrically connected to said pattern first portion,
orientation means on said heat sink member,
a semiconductor device element on said heat sink member having electrodes oriented in a predetermined manner with respect to said orientation means on said heat sink member,
said heat sink member and said die oriented in a predetermined manner with respect to said discrete portions of said conductive pattern,
a portion of each of said discrete pattern portions adapted for electrical interconnection with a die contact pad,
a first housing terminal pin having a portion extending through said board member and electrically connected to one of said discrete pattern portions,
a second housing terminal pin having a portion extending through said board member and electrically connected to the other of said discrete pattern portions,
each of said die electrodes electrically connected to one of said discrete pattern portions, and
a cup-shaped cover element of selected size affixed to said board member over said die, said discrete contacts and terminal pin portions.

2. An economical and highly reliable power semiconductor device which can be made in standard enclosure outlines, said device comprising:
a reinforced plastic board member having two parallel major surfaces,
a conductive pattern on one of said major surfaces, said pattern including a first portion, a second portion separated from the first portion by a space, at least one third portion interconnecting said first and second portions through said space and at least two discrete portions in said space between said first and second portions,
an aperture through said board member and pattern first portion,
a copper heat sink member nested in said aperture with opposite ends of the heat sink projecting beyond the planes on said major surfaces, said ends being flat and generally parallel said board member surfaces,
a soldered connection between said heat sink member and said pattern first portion,
orientation means on said heat sink member,
a semiconductor device die soldered to the end of said heat sink member adjacent said one major surface,
elongated mutually parallel wire bonding pads on said die oriented in a predetermined manner with respect to said orientation means on said heat sink member,
said heat sink member and said die oriented in a predetermined manner with respect to said discrete portions of said conductive pattern,
a discrete contact soldered to each of said discrete portions of said conductive pattern,
a surface portion on each of said discrete contacts of the same metal as said die wire bonding pads,
a first housing terminal pin having a portion extending through said board member and one of said discrete contacts,
a second housing terminal pin having a portion extending through said board member and the other of said discrete contacts,
a soldered connection between said terminal pin portions and their respective discrete contacts,
a first filamentary wire of said same metal pressure bonded at one end to one of said die pads and at the other end to said surface portion of one of the contacts,
a second filamentary wire of said same metal pressure bonded at one end to the other of said die pads and at the other end to said surface portion of the other of the contacts, and
a cup-shaped cover element of selected size affixed to said board member surface over said die, filamentary wires, discrete contacts, and terminal pin portions.

3. An economical and highly reliable power transistor which can be made in standard enclosure outlines, said transistor comprising:
a laminated reinforced plastic board member having two major parallel surfaces,
a conductive pattern on one of said surfaces,
said pattern including a central portion,
a peripheral portion separated from the first portion by a space and covering the balance of said surface outside said space, portions interconnecting said central and peripheral portions through said space, and two discrete portions having elongated mutually parallel and partially overlapping areas in said space between said central and peripheral portions,
an aperture through said board member and pattern central portion,
a recess in the opposite surface of said board member surrounding said aperture,
a generally cylindrical metal heat sink member in said aperture and electrically connected to said pattern central portion,
knurled side surfaces on said heat sink member frictionally engaging said board member, flat ends on said heat sink member perpendicular its longitudinal axis, a flange on one of said ends forming a shoulder that abuts said opposite major surface within said recess, said flange being about 0.002 – 0.01 inch thicker than said recess is deep, at least two flat and mutually parallel radial surfaces on said flange for orienting said heat sink member, a transistor die on said heat sink member having two elongated and mutually parallel contact pads oriented in a predetermined manner with respect to said flat surfaces on said heat sink member flange, said parallel die contact pads oriented generally perpendicular to said parallel areas of said pattern discrete portions, a discrete contact corresponding in size and shape to said pattern discrete portions registered on and soldered to each of said pattern discrete portions, a portion on each of said discrete contacts adapted for electrical interconnection with a die contact pad, a first housing terminal pin having a portion extending through said board member and through an aperture in one of said discrete contacts, a second housing terminal pin having a portion extending through said board member and through an aperture, each of said terminal pin portions soldered to their respective discrete contacts, parallel filamentary wires interconnecting said parallel die contact pads and said discrete contacts, and a cup-shaped cover element that is bonded to said board member surface between said first and second pattern portions, whereby said cover element encloses said die, said discrete contacts and terminal pin portions.

4. An economical and highly reliable power transistor which can be made in standard enclosure outlines, said transistor comprising:

a laminated paper phenolic board member having two parallel major surfaces, a conductive pattern on one of said surfaces, said pattern including a central portion, a peripheral portion separated from the first portion by a generally circular space and covering the balance of said surface outside said space, portions interconnecting said central and peripheral portions through said space and two discrete portions having elongated mutually parallel and partially overlapping areas in said space between said central and peripheral portions, an aperture through said board member and pattern central portion, a circular recess in the opposite surface of said board member surrounding said aperture and generally registered with said circular space on said one surface, a copper heat sink member nested in said aperture with opposite ends of the heat sink projecting beyond the planes of said surfaces, said ends being flat and parallel said board member surfaces, knurled side surfaces on said heat sink member frictionally engaging said board member, a soldered connection between said heat sink member and said pattern central portion, a flange on one flat end of said heat sink member aubtting said opposite surface of said board member within said recess, said flange being about 0.004–0.008 inch thicker than said recess is deep, a generally rectangular radial surface on said flange for orienting said heat sink member, a transistor die soldered to the end of said heat sink member adjacent said one board surface, parallel wire bonding pads on said die oriented in a predetermined manner with respect to said generally rectangular radial surface on said heat sink member flange, said parallel die wire bonding pads oriented perpendicular to said parallel areas of said pattern discrete portions, a discrete contact corresponding in size and shape to said pattern discrete portions registered on and soldered to each of said pattern discrete portions, a surface portion on each of said discrete contacts of the same metal as said die wire bonding pads, a first housing terminal pin having a portion extending through said board member and an aperture in one of said discrete contacts, a second housing terminal pin having a portion extending through said board member and an aperture in the other of said discrete contacts, a soldered connection between said terminal pin portions and their respective discrete contacts, a first filamentary wire of said same metal pressure bonded at one end to one of said die pads and at the other end to said surface portion of one of the contacts, a second filamentary wire of said same metal pressure bonded at one end to the other of said die pads and at the other end to said surface portion of the other of the contacts, said filamentary wires being generally perpendicular to said mutually parallel and partially overlapping areas of said discrete contacts, and a generally circular cup-shaped cover element having a lip that is bonded to said board member in said circular space between said first and second portions whereby said cover element encloses said die, filamentary wires, discrete contacts, and terminal pin portions.

5. An economical method of making highly reliable power semiconductor devices in standard enclosure outlines, said method comprising the steps of:

forming a plurality of linearly arranged repetitive conductor patterns for a transistor enclosure base on a reinforced plastic circuit board member, said pattern for each package base comprising a first portion, a second portion spaced from the first portion, and at least one third portion interconnecting said first and second portions, and at least two discrete portions between said first and second portions, forming a heat sink element with two parallel flat end faces and orientation means with respect to said faces, orienting a plurality of said heat sinks in a predetermined manner, orienting a plurality of semiconductor device dies corresponding to said oriented heat sinks, mounting said oriented semiconductor dies on the faces of said oriented heat sinks to form a plurality of oriented element-heat sink subassemblies in which the element is electrically connected to said heat sink, blanking out a plurality of apertures in said circuit board with respect to each conductor pattern to define a plurality of linear frames containing a plurality of linearly arranged interconnected semiconductive device enclosure bases with each base having at least one aperture therein, cutting said linear frames from said board member, orienting a plurality of die-heat sink subassemblies with respect to said linear frame, press fitting oriented die-heat sink subassemblies into said apertures in said enclosure bases of said linear frame, electrically connecting said die-heat sink subassemblies to said pattern first portions, affixing at least two terminal pins to each of said enclosure bases with a portion of each of said terminal pins projecting through said circuit board and only one of said discrete portions of said conductive pattern, electrically connecting said pattern discrete portions, said terminal pin portions and electrodes on said dies, and affixing a cup-shaped cover element to said circuit board surface over said die, said heat sink, said electrical connections, and said terminal pin portions.

6. An economical method of making a highly reliable power transistor in a standard outline comprising:

forming a linearly arranged repetitive pattern for a transistor enclosure base in a conductive coating on a reinforced plastic circuit board member, said pattern for each enclosure base comprising a central portion, two discrete portions adjacent said central portion having elongated mutually parallel and partially overlapping areas, a peripheral portion spaced from and surrounding said central and discrete portions on the balance of said enclosure base, and at least one portion interconnecting said central and peripheral portions, forming a heat sink element with two parallel flat end faces and orientation means with respect to said faces, orienting a plurality of said heat sinks in a predetermined manner, orienting a plurality of semiconductor device dies corresponding to said oriented heat sinks, mounting said oriented dies on the faces of said oriented heat sinks to form a plurality of oriented die-heat sink subassemblies in which the die is electrically connected to said heat sink, punching out a plurality of apertures in said circuit board member to define a linear frame containing a plurality of linearly arranged connected semiconductive device enclosure bases with said enclosure bases having a hole through said pattern central portion for receiving said assemblies, holes through said pattern peripheral portion for initially indexing said frame and for subsequently mounting said enclosure base on a support means, and a hole through each pattern discrete portion to receive enclosure terminal pins, orienting a plurality of said die-heat sink subassemblies with respect to said linear frame, press fitting die-heat sink subassemblies into said apertures in said pattern central portions of said enclosure bases of said linear frame, electrically connecting said die-heat sink assemblies to said pattern first portions, press fitting terminal pins into said holes in said pattern discrete portions with portions of said terminal pins projecting through said linear frame, placing a subassembly of two fuse-linked contacts corresponding in size and shape to said pattern discrete portions in register on said pattern discrete portions with said terminal pin portions projecting through apertures in said contacts, severing said fuse link between said contacts by passing an electrical current between said terminal pins, electrically connecting and securing together said contacts, said pattern discrete portions and said terminal pin portions, electrically connecting respective electrodes on said element to said contacts, and bonding a cup-shaped cover element to said circuit board surface between said pattern first and second portions to enclose said die, said contacts, said electrical connections and said terminal pin portions.

7. An economical method of making a highly reliable power transistor in a standard enclosure outline comprising:

etching a copper layer on the surface of a laminated paper phenolic circuit board member to form a linear repetitive conductor pattern or a transistor enclosure base, with the pattern for each enclosure base comprising a central portion, two discrete portions adjacent said central portion having elongated mutually generally parallel and partially overlapping areas, a peripheral portion spaced from and surrounding said central and discrete portions on the balance of said enclosure base, and portions interconnecting said central and peripheral portions, identically orienting a plurality of generally cylindrical copper heat sink elements having two parallel flat end faces with a circumferential flange contiguous one of said faces, orienting a wafer containing a plurality of mutually oriented power transistor dies, dicing said wafer while maintaining die orientation to form a plurality of mutually oriented dies, orienting a group of said plurality of power transistor dies with respect to the orientation of said plurality of heat sinks, progressively placing oriented dies from said group of oriented dies on an oriented end face of said plurality of oriented heat sinks and soldering them thereto to form a plurality of identically oriented die-heat sink subassemblies, punching out portions of said circuit board member to define a frame of two linear members with a plurality of aligned, partially formed transistor enclosure bases therebetween and to form in each enclosure base a hole through said pattern central portion, a hole through each of said pattern discrete portions and holes throgh said pattern peripheral portion coextensive with said linear members, identically orienting a group of said die-heat sink subassemblies with respect to said linear frame, progressively press fitting oriented die-heat sink subassemblies into each of said apertures in said pattern central portion of said aligned enclosure bases, press fitting terminal pins into said holes in said pattern discrete portions, with terminal pin portions projecting through said linear frame, registering a subassembly of two fuse-linked pattern contacts corresponding in size and shape to said pattern discrete portions on said pattern discrete portions, with said terminal pin portions projecting through apertures in said contacts, simultaneously soldering together said heat sinks and pattern central portions, and said terminal pin portions, said pattern contacts and said pattern discrete portions, severing the fuse link between said pattern contacts by passing an electrical current between said terminal pins, pressure bonding a first filamentary wire between a contact pad on at least one of said dies and one of its two pattern contacts, indexing said frame using said holes in pattern peripheral portions, pressure bonding a second filamentary wire parallel and substantially overlapping the first between a second contact pad on said die and the other of its pattern contacts, bonding a lip of a cup-shaped cover element to said circuit board surface between said pattern first and second portions to enclose said die, said pattern contacts, said filamentary wires and said terminal pin portions, and punching out the remaining portions of said package base coextensive with said first linear members to produce an aligned linear array of discrete power transistors.

* * * * *